United States Patent [19]

Micheron

[11] 4,369,391

[45] Jan. 18, 1983

[54] PRESSURE-SENSING TRANSDUCER DEVICE HAVING A PIEZOELECTRIC POLYMER ELEMENT AND A METHOD OF FABRICATION OF SAID DEVICE

[75] Inventor: François Micheron, Paris, France

[73] Assignee: Thomson-CSF, Paris, France

[21] Appl. No.: 158,459

[22] Filed: Jun. 11, 1980

[30] Foreign Application Priority Data

Jun. 13, 1979 [FR] France ............................ 79 15141

[51] Int. Cl.³ ...................... H01L 41/08; H03B 5/32
[52] U.S. Cl. ................................... 310/800; 310/332; 179/110 A; 174/117 F
[58] Field of Search ............. 310/332, 800; 367/141, 367/157, 170; 179/111 R, 111 E, 110 A; 174/110 F, 110 FC, 110 PM, 110 V

[56] References Cited

U.S. PATENT DOCUMENTS

| 3,750,127 | 7/1973 | Ayers et al. ...................... 310/800 |
| 3,816,774 | 6/1974 | Ohnuki et al. ..................... 310/332 |
| 3,859,477 | 1/1975 | Skvoy ............................... 179/111 R |
| 3,862,477 | 1/1975 | Ayers et al. ...................... 310/800 |
| 4,183,010 | 1/1980 | Miller .............................. 310/800 |
| 4,330,730 | 5/1982 | Kurz et al. ....................... 310/800 |

FOREIGN PATENT DOCUMENTS

961606  6/1964  United Kingdom ............ 310/332

*Primary Examiner*—J. D. Miller
*Assistant Examiner*—D. L. Rebsch
*Attorney, Agent, or Firm*—Oblon, Fisher, Spivak, McClelland & Maier

[57] ABSTRACT

A pressure-sensing piezoelectric transducer device having an active element fabricated from polymeric material which has previously been polarized and comprising electrodes, at least one of which is embedded in the polymeric material. The device has the configuration of a multiwire cable or of a molded object.

4 Claims, 13 Drawing Figures

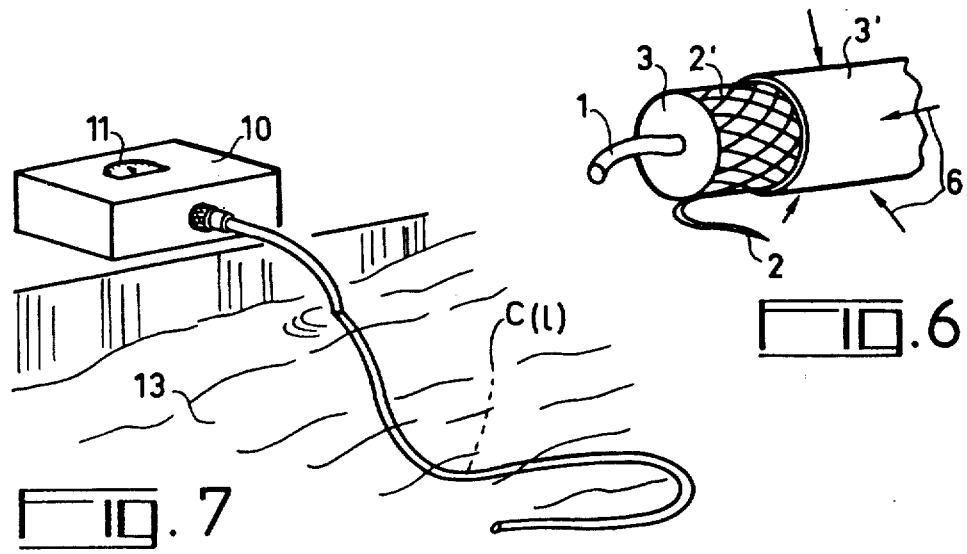
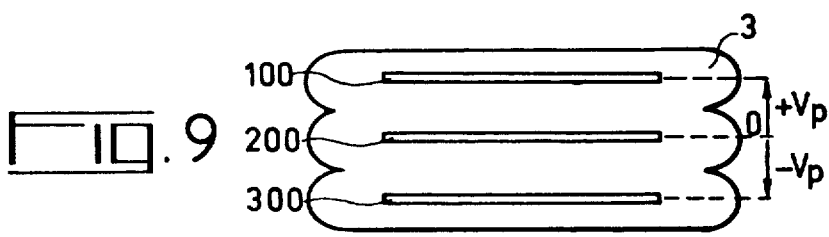
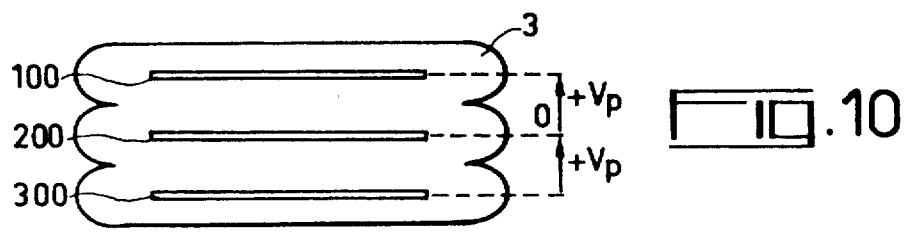
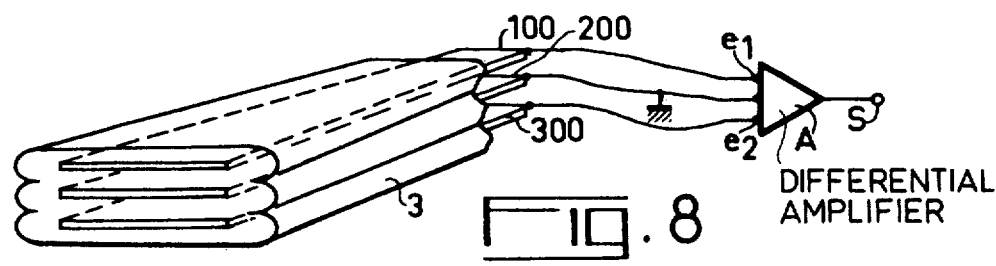

PRESSURE-SENSING TRANSDUCER DEVICE HAVING A PIEZOELECTRIC POLYMER ELEMENT AND A METHOD OF FABRICATION OF SAID DEVICE

BACKGROUND OF THE INVENTION

1. Field of the Invention

This invention relates to piezoelectric transducer devices in which the active element consists of a polymeric material having piezoelectric properties which are similar to those of substances belonging to certain classes of crystals when said material has been subjected to a suitable treatment. Polymers in which such effects can be developed are numerous. The following can be mentioned by way of indication: polyvinylidene fluoride ($PVF_2$), polyvinyl chloride (PVC), polyvinyl fluoride (PVF) as well as copolymers such as, for example, polytetrafluoroethylene-polyvinylidene fluoride ($PTFE-PVF_2$).

2. Description of the Prior Art

In the known art, these materials are employed in the form of flat films which are metallized on both faces and may or may not have been oriented mechanically but are polarized in all cases by application of an intense electric field (of the order of 1 MV/cm) at a temperature which is higher than or equal to room temperature. By means of this treatment, films of polymeric material acquire piezoelectric properties which makes it possible to employ them as transducers. Potential applications of these flat films include pressure and displacement sensors (microphones, hydrophones, strain gages, and so on). More recently, it has been proposed to employ these materials after thermoforming or molding in suitable shapes so as to produce earphone, loudspeaker or microphone diaphragms. Transducer devices of this type are described, for example, in French patent application No. 77 34 589 filed on Nov. 17, 1977 in the name of the present applicant and published under No. 2,409,654.

Fabrication of these transducers gives rise to many problems of a technological order, such as those related to coating operations, leading-out of connecting wires, the choice of design parameters which becomes more difficult as the transducer or sensor is of smaller size, and problems of metallization for the formation of electrodes. The size of a sensor is greatly dependent on the type of measurement to be performed (point measurement, measurement integrated on a surface), with the result that each sensor has to be designed as a function of the purpose for which it is specifically intended. Furthermore, certain types of measurement require a very large number of transducers.

In the case of many applications, it would be an advantage to be able to make use of inexpensive transducers fabricated from standardized elements on a large-scale, continuous production basis.

In order to satisfy these requirements, the invention proposes transducer devices having a structure which is similar to that of multiconductor electric cables and manufactured in accordance with the same techniques. Some variants also permit the direct use of electric cables of the type comprising an insulator made of polymeric material and activated by means of a treatment which is identical in all respects to the treatment employed for activating the polymer sheets of transducer materials of the prior art. The invention also proposes molded transducer devices involving the application of techniques usually employed for producing connectors.

SUMMARY OF THE INVENTION

The invention is therefore directed to a pressure-sensing transducer device comprising at least two conducting electrodes and one element of polymeric material which is capable of exhibiting piezoelectric properties for activating at least those regions of the polymeric material which are located between the electrodes by induction of an anisotropy in the polymeric material as a result of a suitable treatment. The device is mainly distinguished by the fact that it has the configuration of a cable of predetermined length comprising a plurality of conductors, at least one conductor being embedded in the polymeric material which forms an insulator. Each conductor constitutes one electrode and said conductors are stripped at least at one end of the cable, thus making it possible to establish electrical connections with external electronic matching circuits.

BRIEF DESCRIPTION OF THE DRAWINGS

These and other features of the invention will be more apparent upon consideration of the following description and accompanying drawings, wherein:

FIGS. 6 and 7 illustrate a second alternative embodiment of transducers in accordance with the invention;

FIGS. 8 to 10 illustrate a third alternative embodiment of transducers in accordance with the invention;

DESCRIPTION OF THE PREFERRED EMBODIMENTS

In the following description, the elements which are common to two or a number of figures are designated by the same references and will be described only once.

Figure 1:
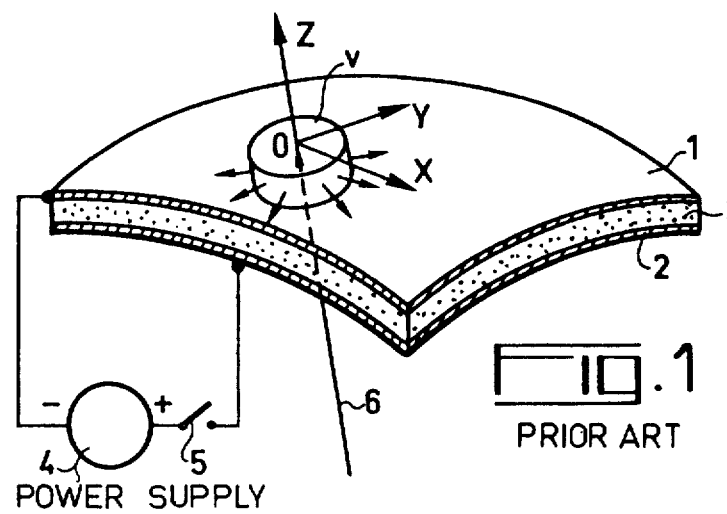
FIG. 1 illustrates schematically a piezoelectric transducer of the prior art.

The schematic diagram of FIG. 1 illustrates a transducer in accordance with the prior art and composed of a sheet of polymeric material 3 covered on both faces by the electrodes 1 and 2. These electrodes can be formed by metallizing said sheet 3. By way of example, said polymeric material can be polyvinylidene fluoride ($PVF_2$). As is well known, the structure of $PVF_2$ is composed of spheroidal crystal regions contained in an amorphous phase. The macroscopic mechanical properties are those of an isotropic substance. This polymer has three distinct crystal forms $\alpha$, $\beta$ and $\gamma$. The $\alpha$ form is obtained from the molten polymer. The molecular chains are coiled in a helix and have an arrangement of atoms of carbon, hydrogen and fluorine such that the electric dipole moments compensate for each other when progressing along the chain. The $\beta$ form and the $\gamma$ form which is similar to this latter are less stable than the $\alpha$ form and are characterized by a zigzag chain and by electric dipole moments whose effects are added. If consideration is given to a small volume element v of the polymeric material, this element therefore comprises a certain number of chains representing a highly polar solid phase I ($\beta$ and $\gamma$ phase). If the polymeric material has not been subjected to any stress after solidification, it is endowed with good mechanical stability and can be considered as electrically isotropic from a macroscopic point of view since it has not been electrically polarized. It is also known that, in order to establish piezoelectric properties in polyvinylidene fluoride as well as in other polar polymers, these materials have to be subjected to substantial stretching in order to convert the non-polar phase II to the polar phase I. This stretching process induces a mechanical anisotropy. In order to produce the electrical anisotropy which is necessary for the appearance of piezoelectric effects, the material is subjected to an electric field having a direction which is essentially orthogonal to the electrodes or, in other words, a direction parallel to the axis Z in FIG. 1. The sheet 3 of polymeric material which has thus been treated forms a transducer element which produces a proportional voltage when heated or when subjected to an external stress represented by the arrow 6. Conversely, a voltage applied between these electrodes produces proportional mechanical deformations along the axis Z in the plane XY. In the case of certain polymeric materials such as polyvinylidene fluoride, for example, it is possible to omit the mechanical stretching stage and to induce an anisotropy in the material solely by electrical means.

Devices which are fabricated from a sheet of active polymeric material and comprise electrodes deposited on the two faces of the sheet are nevertheless subject to the disadvantages which have been recalled in the foregoing.

In contrast to the prior art in which the metallic electrodes are essentially deposited on the surface of the piezoelectric material, the present invention proposes to embed at least one electrode in said material. This technique is compatible with the procedure adopted in wiredrawing of multiconductor cables and permits the construction of inexpensive transducer devices which are manufactured in continuous production and employed in sections in the same manner as multiconductor electric cables.

The most simple example which can be given is that of a two-wire cable for the supply of current to low-power electrical appliances. The cable insulator is chosen from the family of polar polymers mentioned earlier and the two conductors constitute the electrodes of the transducer. This cable must be subjected to a suitable treatment in order to activate the material constituting the insulator at least in the regions located between the conducting wires. This treatment is identical in all respects to the treatment applied to the polymer material which constitutes the active element of transducers of the prior art. A high voltage is applied between the conductors, the cable being placed within an enclosure heated to a sufficiently high temperature over a fairly long period of time in order to ensure that the dipolar orientation takes place within the insulator which is located between the two conductors. After cooling in an electric field, a length of cable is cut to the desired length in order to fabricate a transducer device. The conductors are stripped at one end and constitute the two connecting leads of the measuring circuit.

A structure of this type constitutes a first alternative embodiment of a transducer device in accordance with the invention and will be described with reference to FIGS. 2 to 5.

Figure 2:
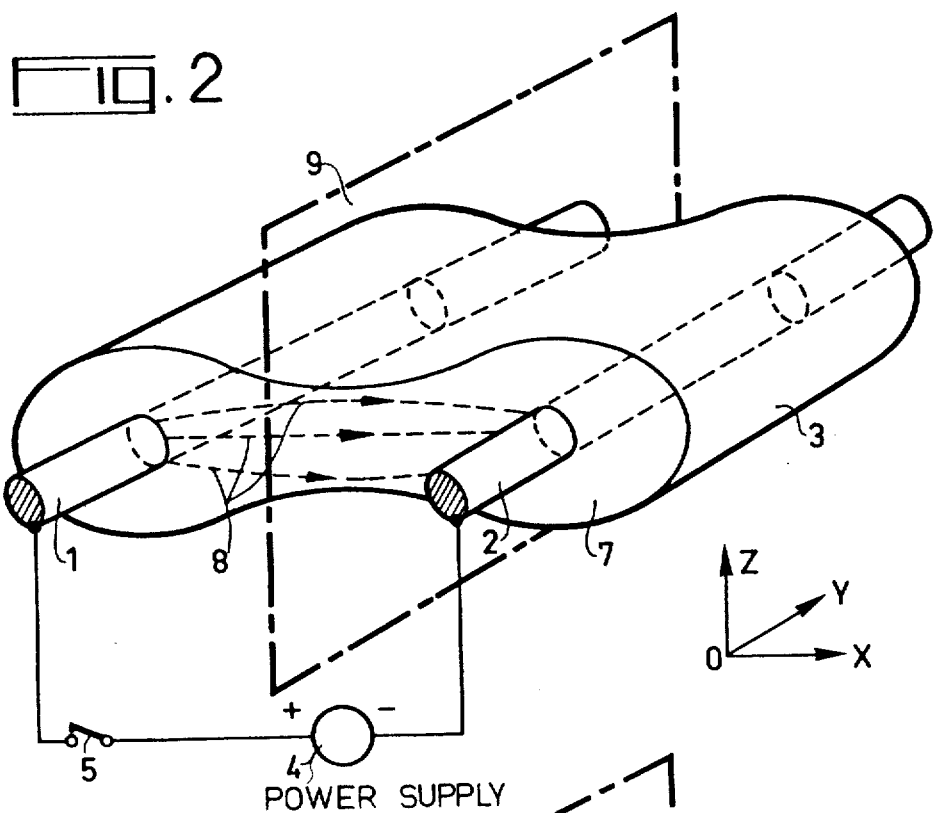
Figure 3:
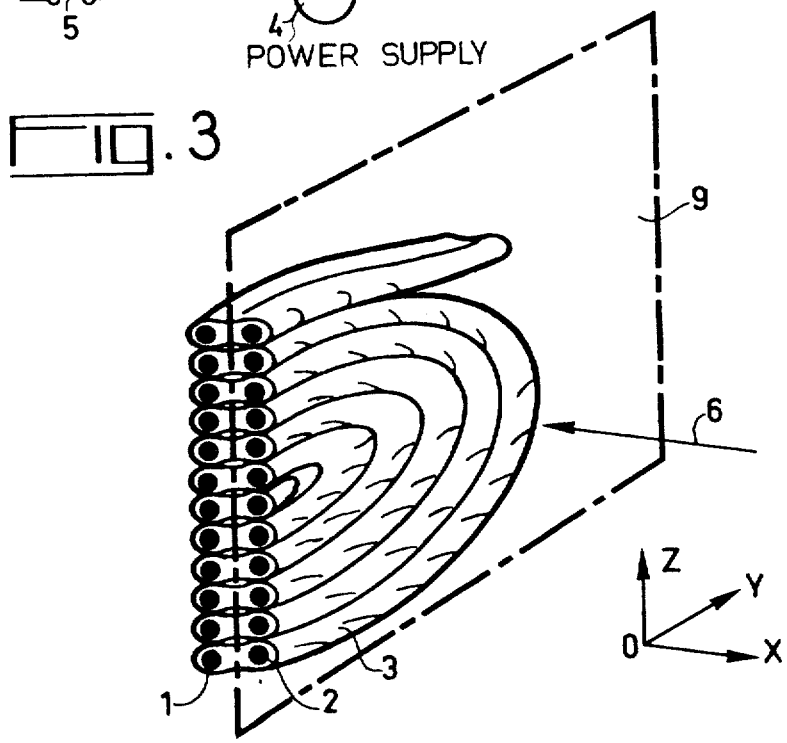

FIG. 2 shows a fragment of the flat two-wire cable. This cable has a plane of symmetry 9 which is parallel to the two conductors 1 and 2. These two conductors are coated with an insulator 3 of plastic material. Within the scope of the invention, the insulator 3 must be formed of polymeric material which is capable of exhibiting piezoelectric properties.

In order to induce these properties within the material of the sheath 3, the two conductors 1 and 2 will be connected to a source of electrical energy 4 for producing a direct-current high voltage which will be applied to the electrodes 1 and 2 via the switch 5 for a sufficiently long period of time. During this time interval, the assembly is placed within an enclosure which is heated to a high temperature but remains below the melting point of the material of the insulator 3. In consequence, a dipolar orientation is induced within the insulator, essentially within the region located between the two conductors. The resultant lines of force 8 are shown diagrammatically in the section plane 7 of FIG. 2. The elementary sensor thus constituted is essentially responsive to pressure differences exerted in directions parallel to the axis OX of the reference trihedron OXYZ. In order to increase this sensitivity, the length of the cable which is subjected to such pressures is increased.

This alternative form of transducer can be employed in particular for uniaxial pressure measurements. In this case and in order to increase the sensitivity, a predetermined length of cable is coiled in the form of a spiral having contiguous turns as illustrated in the sectional view of FIG. 3. This spiral retains the same plane of symmetry 9. The sensor thus constituted is essentially responsive to pressures in the direction of the arrow 6, that is, the direction parallel to the axis OX.

Figure 4:
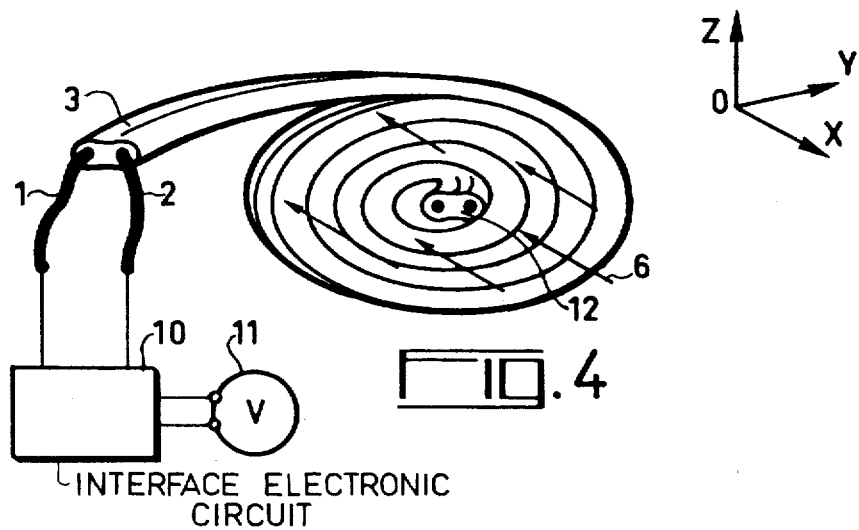
FIGS. 2 to 5 illustrate a first alternative embodiment of transducer devices in accordance with the invention.

As illustrated in FIG. 4, one end of the cable is stripped and the conductors 1 and 2 are connected to electronic circuits 10 for matching and if necessary for amplification of the electrical signals collected at the terminals of these conductors. The electronic circuits 10 aforesaid are in turn connected to a measuring instrument 11 which can be either of the analog or digital display type. The end portion 12 of the sensor can be made electrically insulating, for example by heating the insulator locally to the melting point in order to cover the ends of the conductors 1 and 2.

A pressure sensor constructed in accordance with the variant just described has been tested experimentally. To this end, a length of 1 meter of two-wire cable consisting of two braided copper conductors having a cross-sectional area of 1.5 mm$^2$ and coated with polyvinylidene chloride was wound in a coil. The spiral thus formed was maintained in position by means of an adhesive having high-temperature resistance. The coil was then placed in an enclosure which had been heated to a temperature of 100° C. and the conductors were connected to an electric generator which delivered a voltage of 7 KV. This polarization was maintained for a period of two hours, whereupon the temperature was restored to room temperature within a period of one half-hour (the voltage of 7 KV being maintained).

The spiral being placed flat on a plane, a weight of 1 kilogram placed on the spiral generates a voltage of 50 mV between the conductors 1 and 2.

This corresponds to an apparent piezoelectric coefficient of lower value than the coefficient measured on pure polyvinyl chloride. The difference between these two coefficients essentially arises from the plasticizer which is usually introduced in the cable sheath and is mixed with polyvinyl chloride, which has the effect of reducing the dipole concentration and may consequently inhibit the dipolar orientation.

It is common practice in cable manufacture to employ polymers other than PVC and in particular the PVF$_2$-PTFE copolymer marketed by the firm known as Pennwalt under the trade name "Kynar 7200" or the PVF$_2$ marketed by the company known as Pechiney Ugine Kuhlmann under the trade name "Foraflon" or by the Solvay Company under the trade name "Solef." The piezoelectric coefficients of these polymers which are polarized after melting are of a higher order than those of PVC.

The invention therefore makes it possible to produce sensors at very low cost by means of a simple process and starting from standardized elements or, in other words, flat two-wire electric cables which are cut to the desired length. Since these cables are intended to provide connections for electrical equipment units, they do not have optimized characteristics for the fabrication of transducers in accordance with the invention. Without thereby reducing the advantages offered by the invention, cables of this type can be manufactured more specifically by choosing in particular a more suitable polymeric material for the application which is contemplated. The same techniques as those employed in conventional wiredrawing can accordingly be adopted. A point worthy of note is that, at the time of manufacture of the cable, the material constituting the insulator (that is, the polymeric material 3) is subjected to an orientation in a liquid medium in all cases. This makes it possible to employ all the polar polymers and not only those polymers in which an anisotropy may be induced solely by electrical means.

Figure 12:
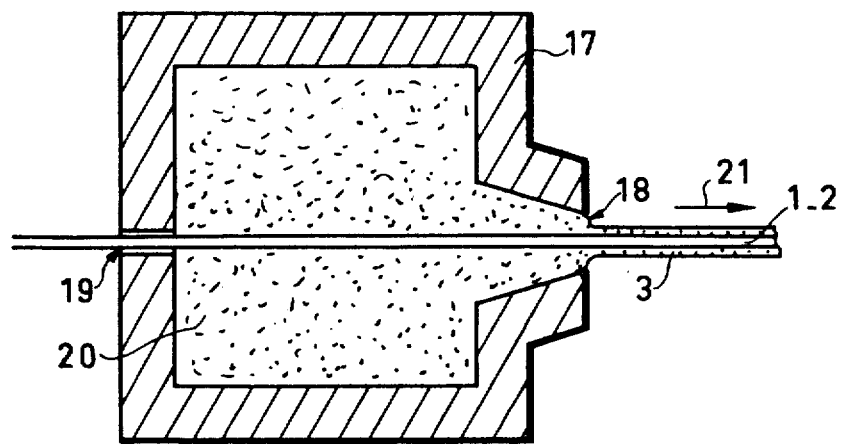
FIGS. 12 and 13 illustrate one of the steps of the method of fabrication of devices in accordance with the invention.

In fact, if reference is made to FIG. 12 which is a schematic illustration of a die, the conductors 1 and 2 are introduced through an orifice 19 pierced in the die casing 17 containing the polymeric material to be coated. This material passes out through a conical orifice 18 together with the conductors in a movement which takes place in the direction of the arrow 21. Depending on the dimensions of the orifice 18 and the conditions of extrusion, the material 20 which is intended to constitute the insulator 3 is drawn to a variable extent depending on coefficients which vary between 100% and 300% approximately.

Finally, the cable may be activated only in certain predetermined portions: it is possible to suppress the induced polarization in the unwanted portions by heating the polymeric material of the regions concerned to the melting point.

Figure 5:
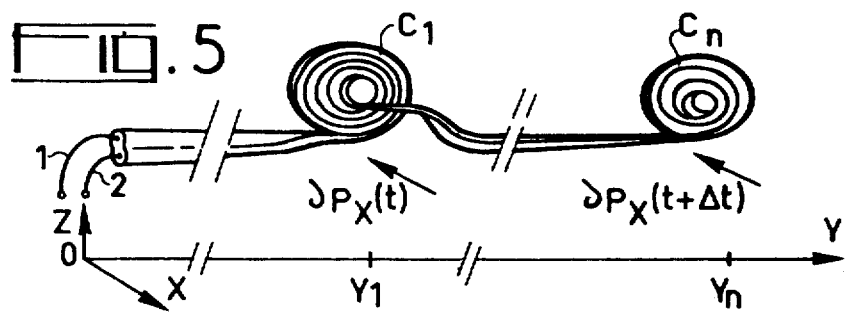

Pressure sensors of the type illustrated in FIG. 4 can be placed on a bus-type line. It is possible in particular to extend the cable at the end portion 12 by bringing this latter out of the spiral and thus (as shown in FIG. 5) constituting a system of pressure sensors C$_1$ to C$_n$ which are uniformly spaced along a two-wire bus-line.

A system of this type can be employed for measuring the pressure waves produced by an object which undergoes a displacement along an axis, for example along the axis OY. At the instant t, the position of the object will be Y$_1$ and at the instant t+Δt: Y$_n$. The voltage developed between the terminals of the conductors 1 and 2 will be proportional respectively to ∂P$_X$(t) and ∂P$_X$(t+Δt). This constitutes one non-limitative example of application of a first alternative embodiment of devices in accordance with the invention.

A second alternative embodiment of transducer devices in accordance with the invention is illustrated in FIG. 6.

Instead of making use of two-wire cables, an alternative possibility which can in fact be contemplated consists in employing a coaxial cable having a copper core 1 surrounded by a dielectric insulator 3 and a braided-wire element 2'. An outer sheath 3' can be provided and serves in particular for electrical insulation as well as protection of the cable against aggressive environmental media. The braided element 2' can be soldered at one end to a conductor 2. A transducer constructed by means of a cable of this type and subjected to the treatment described earlier can be employed as a pressure sensor and especially for measurement of hydrostatic pressure since it is responsive to pressures directed radially as indicated by the arrows 6. It should be noted that the sheath 3' does not perform any transducer function and only the region 3 is activated.

FIG. 7 illustrates diagrammatically the application of a sensor of this type to hydrostatic pressure measurements. The coaxial cable having a length 1 produces a sensor C(1) which can be immersed in a liquid medium 13 and connected to a measuring instrument 10-11. An entire surface of said cable can thus be covered, the measured pressure being proportional to the total length of the sensor, that is, to the total length of the coaxial cable. A coaxial configuration also has the advantages over a two-wire configuration in that is provides an electrostatic screen constituted by the braided-wire element 2' which surrounds the central conductor and minimizes the collection of electromagnetic radiations which would be liable to induce a parasitic voltage in the conductors 1 and 2 and thus to impair the accuracy of measurements.

It is also possible to employ cables having more than two conductors and especially an odd number of conductors such as the three conductors illustrated by way of example in FIG. 8. Thus the conductors 100, 200 and 300 which are embedded in the insulator 3 of polymeric material should preferably be designed in the form of a strip in order to ensure that the opposite surfaces of these conductors have the largest possible area. The treatment to which this cable is subjected is the same as the treatment described earlier. The electrodes can be polarized in pairs by means of sources of electric energy having opposite polarities such as those shown in FIG. 9. The pair of electrodes 100 and 200 is polarized by means of a voltage +V$_p$ and the pair of electrodes 200 and 300 is polarized by means of a voltage V$_p$, it being assumed that the electrode 200 is connected to ground or in other words to a zero potential. The electrodes 100 and 300 are connected to the inputs e$_1$ and e$_2$ of a differential amplifier A. If the cable which has thus been polarized is subjected to a compression along an axis perpendicular to the surface of the electrodes, the voltage developed between the electrodes 100 and 300 is substantially zero. On the other hand, if the same cable is subjected to a bending stress, the voltage collected between the electrodes 100 and 300 is no longer zero and represents the intensity of said bending stress, this voltage being collected after amplification on the output S of the differential amplifier A.

Now if the pairs of electrodes 100-200 and 200-300 are polarized with a voltage +V$_p$ having the same polarity as indicated in FIG. 10, the cable will no longer be responsive to a bending stress but to a compressive stress.

These two modes of operation also depend on the character of the input terminals of the amplifier A. Depending on whether these inputs are additive or subtractive, the reverse functions with respect to the foregoing description can be performed by means of the two polarized sensors in accordance with the diagrams of FIGS. 9 and 10.

Finally, without departing from the scope of the invention, it is possible to provide transducer devices having embedded electrodes which are not designed in the form of cables. In this case, it is possible to adopt the techniques employed in the manufacture of electric connectors and to produce transducer devices which are molded in the mass.

Figure 11:
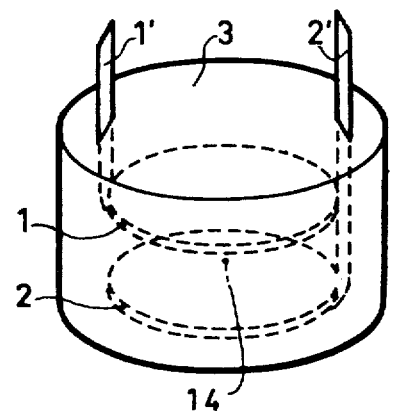
FIG. 11 illustrates a fourth alternative embodiment of transducers in accordance with the invention.
Figure 13:
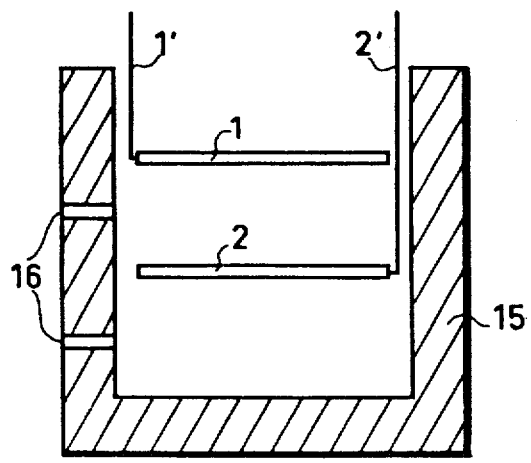

Any desired forms of transducer devices can be obtained by injection of polymer into a mold in which electrodes are placed and maintained in predetermined spatial relation. The technique proposed is related to the technique employed in the manufacture of electric connectors in which the insulating materials are selected from polar polymers which are activated as a result of the treatment described earlier. The most simple example of a sensor in accordance with this fourth alternative embodiment is illustrated in FIG. 11. This sensor comprises two flat circular electrodes 1 and 2 defining a region 14 which can be made active and is located in a mass of polymeric material 3 in which said electrodes are embedded. Connections 1' and 2' emerge from the top face of this device. The method of fabrication is illustrated diagrammatically in FIG. 13. The mold 15 has two orifices 16 through which the polymeric material is introduced by injection in the state of paste. The two electrodes 1 and 2 can be held in position simply and solely as a result of the mechanical rigidity of the connections 1' and 2'.

In an industrial version, the complete assembly can be presented in a form which is similar to an over-molded male or female electric plug component.

The polymeric material can also be introduced into the mold in powdered form and heated to a temperature (and under pressure) such that the material begins to melt.

In this alternative embodiment, it is particularly advantageous to employ polymeric materials in which piezoelectric effects can be obtained solely by electrical means.

This alternative embodiment can be put to practical use as a shock detector in chronometry.

The invention is not limited either to the examples of construction which have just been described or to the examples of application of the transducer devices thus constructed.

The polymeric material can be selected from the following polymers: polyvinyl chloride, polyvinyl fluoride, polyvinylidene fluoride, polychlorofluoethylene, or else the following copolymers: polyvinyl fluoride-polytetrafluoroethylene, polyvinyl fluoride-polyvinylidene fluoride or a chlorinated polyethylene in which the constituents are polyethylene, polyvinyl chloride and polyvinylidene chloride.

What is claimed is:

1. A pressure-sensing transducer device having the configuration of a flat cable of predetermined length comprising two conductors, each constituting one electrode embedded in a polymeric material forming an insulator, said polymeric material being capable of exhibiting pizoelectric properties for activating at least those regions of said polymeric material which are located between said two conductors in order to have dipolar orientations along lines of force located between the two electric conductors in planes at right angles to the plane of symmetry of said conductors with each said conductor being stripped at least at one end of said cable in order to establish electrical connections with an external medium wherein said cable is also coiled in such a manner as to insure that each said two conductors forms a spiral, the spirals being contained in two parallel surfaces.

2. A pressure-sensing transducer device having the configuration of a flat cable of predetermined length comprising two conductors, each constituting one electrode embedded in a polymeric material forming an insulator, said polymeric material being capable of exhibiting pizoelectric properties for activating at least those regions of said polymeric material which are located between said two conductors in order to have dipolar orientations along lines of force located between the two electric conductors in planes at right angles to the plane of symmetry of said conductors with each said conductor being stripped at least at one end of said cable in order to establish electrical connections with an external medium wherein said cable comprises an odd number of conductors provided in the form of parallel metallic strips each constituting one electrode, and wherein those regions of said polymeric material which are located between the planes formed by said metallic strips are activated so as to exhibit dipolar orientation along lines of force essentially at right angles to the planes of said metallic strips and in opposite direction from one region to the next.

3. A pressure-sensing transducer device having the configuration of a flat cable of predetermined length comprising two conductors, each constituting one electrode embedded in a polymeric material forming an insulator, said polymeric material being capable of exhibiting pizoelectric properties for activating at least those regions of said polymeric material which are located between said two conductors in order to have dipolar orientations along lines of force located between the two electric conductors in planes at right angles to the plane of symmetry of said conductors with each said conductor being stripped at least at one end of said cable in order to establish electrical connections with an external medium wherein said cable comprises an odd number of conductors provided in the form of parallel metallic strips each constituting one electrode, and wherein those regions of said polymeric material which are located between the planes formed by said metallic strips are activated so as to exhibit dipolar orientations along lines of force essentially at right angles to the planes of said metallic strips and in same direction from one region to the next.

4. A pressure-sensing transducer device comprising two flat conducting electrodes placed in opposite relation and one element of polymeric material which is capable of exhibiting piezoelectric properties for activating at least that region of said polymeric material which is located between said two electrodes by induction of an anisotropy in said polymeric material as a result of a suitable treatment, the body of said device being such as to have the configuration of a molded object formed by injection molding of said polymeric material with said two electrodes being embedded and spaced apart in said polymeric material constituting the body of the device and the activated region located between the two electrodes aforesaid being such as to exhibit a dipolar orientation along lines of force essentially at right angles to the surfaces of said electrodes, electric conductors forming extensions of said electrodes being further provided for establishing electrical connections with the exterior of the device.

* * * * *